United States Patent [19]

Aufiero

[11] Patent Number: 4,710,966
[45] Date of Patent: Dec. 1, 1987

[54] DIGITAL FRAME PROCESSOR PIPE LINE CIRCUIT

[75] Inventor: James M. Aufiero, Reading, Mass.

[73] Assignee: Itek Corporation, Lexington, Mass.

[21] Appl. No.: 930,041

[22] Filed: Nov. 12, 1986

Related U.S. Application Data

[63] Continuation of Ser. No. 568,025, Jan. 4, 1984, abandoned.

[51] Int. Cl.[4] .......................... G06K 9/00; G06F 13/00
[52] U.S. Cl. ...................................... 382/69; 358/137;
358/335; 364/900; 365/220
[58] Field of Search ... 364/900 MS File, 200 MS File;
365/220; 358/133, 134, 137, 138, 166, 335;
382/69

[56] References Cited

U.S. PATENT DOCUMENTS 3,967,247 6/1976 Andersen et al. .................. 364/200
4,302,775 11/1981 Widergren et al. .................. 382/56
4,430,675 2/1984 Fujime ................................. 358/342
4,473,850 9/1984 Foerster et al. ..................... 358/343

Primary Examiner—Leo H. Boudreau
Attorney, Agent, or Firm—Michael H. Wallach; Robert F. Rotella

[57] ABSTRACT

A plurality of digital words representing picture elements are sequentially loaded into a readin register, which words are thereafter written in parallel into a random access memory via a write data register. The words are subsequently readout of the random access memory in parallel into a read data register and to a readout data register which thereafter sequentially transmits the words stored therein to an output circuit. The arrangement is such that each word may flow through the pipeline to be processed during a clock period of P ns; although the RAM response time is greater than P ns.

5 Claims, 1 Drawing Figure

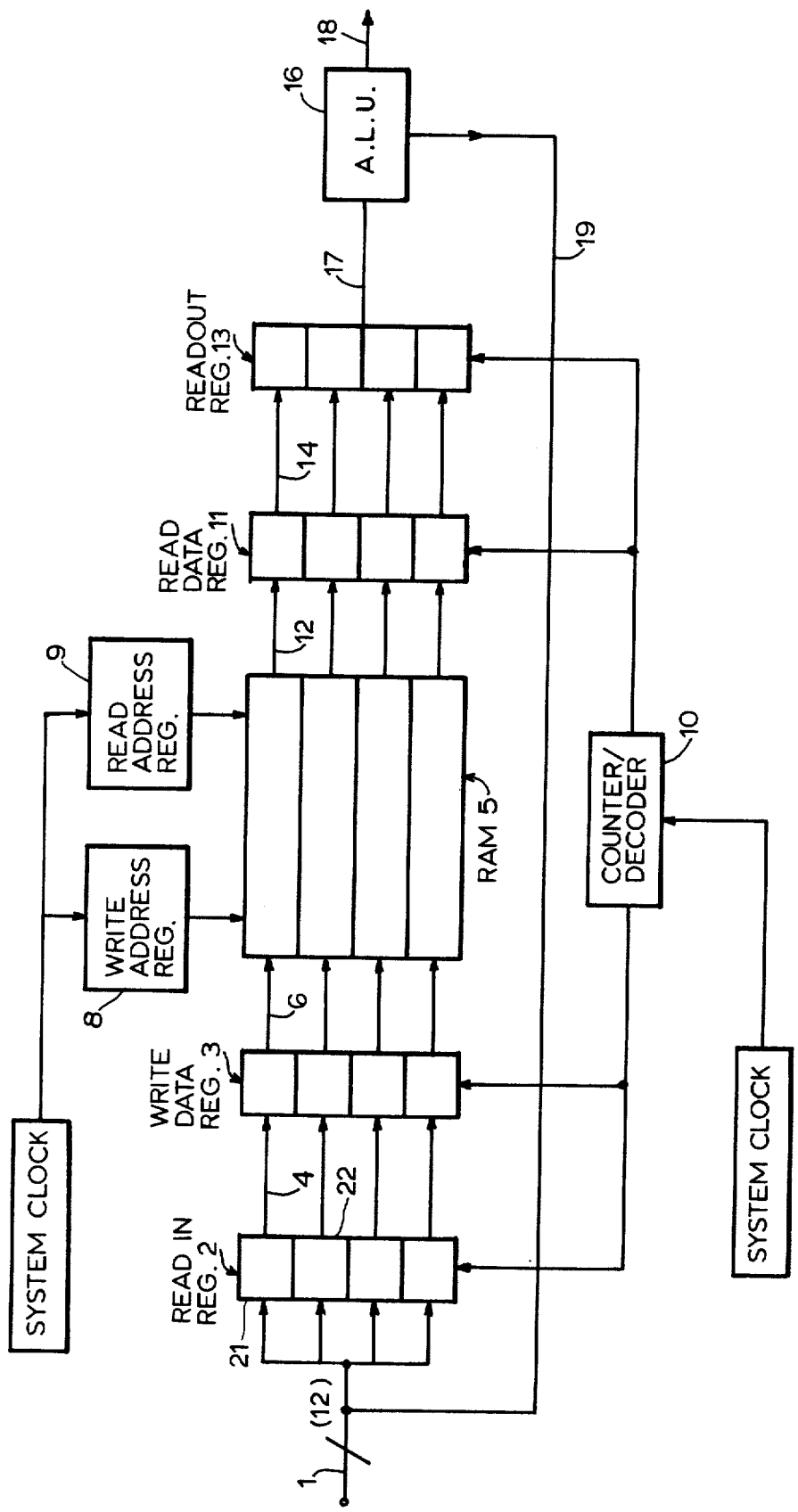

DIGITAL FRAME PROCESSOR PIPE LINE CIRCUIT

This application is a continuation of application Ser. No. 568,025, filed Jan. 4, 1984, now abandoned.

BACKGROUND OF THE INVENTION

In the present digital radiography system, a 30 frame per second vidicon camera produces streams of analog data indicating the intensity of the viewed radiographic imagery, and applies such signals to an analog to digital converter which thereafter produces binary words, each word representing each picture element or pixel of each picture frame. These words are applied to the input of a pipeline circuit which, in conjunction with an ALU performs processing in real time on the picture elements of each frame, and after such processing, ultimately causes analog signals to be applied to a CRT circuit which are representative of the final digital output signals from the data processing system. These operations performed in real time, include time interval differencing, edge enhancement, enhancement of high spatial frequency images and the like. Since it is of utmost importance to operate upon the picture elements representing the viewed images in real time, pipeline circuitry is employed in conjunction with RAMS which store the digital words making up each frame of pixels or picture elements, to facilitate processing. During design of the pipeline circuitry, it was deemed desirable to input and output each pixel words through the pipeline circuitry, one word during each 120 ns clock period. However, the random access memory within the pipeline, which was desired for the design, required a minimum response time for readin, and for readout operations, each of which exceeded the 120 ns clock period. In other words, since real time processing of 30 frames per second is required, readin and readout of 30 frames or arrays of picture elements, each element represented by a 12 bit word, must be performed in each second. However RAMS were not available which could operate at a higher clock frequency then clocks having a period of 160 ns, so that straight forward inputting of the words could not be performed at a data rate higher than the rate constrained by the minimum 160 ns pulse period required to operate the RAM within the pipeline. Thus, what was desired was to process one 12 bit word pixel through the pipeline every 120 ns, even though the minimum RAM response time was substantially longer.

SUMMARY OF THE INVENTION

In accordance with a preferred embodiment of the invention, binary words serially applied to the input of the pipeline circuit are sequentially read in and stored within a readin register and in like manner words are serially readout of a readout register, each word being inputted and outputted during a period of P ns. The words are applied in parallel to the RAM by a write data register coupled to the readin register during a write interval which is greater than the clock period, and which is equal to or greater than the required minimum RAM readin response time. In like manner, words are readout of the RAM in parallel during a required minimum RAM response time which exceeds the period of the clock employed to operate the readin and readout registers, and thus the above mentioned problem is solved.

BRIEF DESCRIPTION OF THE DRAWING

Other objects, features and advantages of the present invention will become apparent upon the study of the specific description taken in conjunction with the sole FIGURE which is a block diagram of the digital frame processor pipeline circuit according to the invention.

SPECIFIC DESCRIPTION

Referring now to the sole FIGURE, a random access memory or RAM 5 is illustrated having a write address register 8 and a read address register 9 coupled to address, write and readout the RAM in the conventional manner. RAM 5 comprises a group of four 64K × 12 bit stores which may contain 256K 12 bit words of data. In the manner of random access memories, any 12 bit data word, each representing a pixel or picture element, may be inserted into any one of the 64K word cells within RAM 5, in accordance with the binary number contained within write address register 8. However, as presently configured, the same location in each of the four 64K × 12 bit stores is addressed in each case. This in effect provides a 64K × 48 bit memory, with 48 lines available for data input and output. Twelve bit words each representing a pixel are applied at data input 1 of the pipeline, and are transmitted to RAM 5 via readin register 2 and write data register 3. The frame processor must be able to process 30 frames per second, each frame comprising 512 × 512 or 256K, 12 bit picture elements or pixels. After insertion, the data is read out of RAM 5 by read data register 11 in the conventional manner, and is transmitted to output bus 18 via read data register 11, readout register 13. In the illustrated example data passes through arithmetic logic unit or ALU 16. Generally, the data read out from RAM 5 is operated on by ALU 16, and is applied back to input bus 1 to be reinserted into register 2, via bus 19. The operations performed within the ALU form no part of the present invention, and hence will not be further discussed. Broadly speaking, the ALU manipulates the words stored in the RAM, to process each of 256K 12 bit words making up a picture frame thereby enhancing frames of graphic images represented by the words. For a detailed explanation of the operation see copending application Ser. No. 568,013 entitle "REAL TIME DIGITAL DIAGNOSTIC IMAGE PROCESSING SYSTEM" filed on even date herewith and assigned to the same assignee as the present invention.

Since real time processing of received images is required, 30 picture frames per second must be processed so that the readin and readout of 30 groups of 256K picture elements, each element represented by a 12 bit word must be performed in one second. This means $7.68 \times 10^6$ words per second must be processed leaving $1/7.68 \times 10^6$ or $0.130 \times 10^{-6}$ or 130 ns to process each word. Based on this a clock time of 120 ns was established in the aforementioned system. On the other hand it was desired to use access memories or RAMS of a convenient memory size which had read and write times of 160 nano-seconds (ns). Thus, inputting the 12 bit words into the RAM and reading them out, could not be performed at a data rate higher than that rate constrained by the minimum 160 ns pulse period. What was desired was to input or output one 12 bit word pixel through the pipeline of the figure every 120ns. However, since the RAM response time, both in the readin and readout mode, was 160 ns, the desired goal could not be accomplished with the straight forward application of each word to the input data bus of the RAM every 120 ns.

In accordance with the present invention, a commercially available sequential readin register 2, and write data register 3 are coupled between input bus 1 and the input data bus 6 of RAM 5. Register 2 is made up of four 12 bit register sections separately addressable and all of which have their inputs tied in common to input pipe line 1. Registers 3 are buffer registers for the four sections of register two and thus have a total of 48 input lines and 48 output lines. The bus 4 thus is a 48 line bus coupling registers 2 and 3. Bus 6 is also a 48 line bus. Additionally, a read data register 11, coupled to the 48 line output data bus 12 of RAM 5 is also provided, having its output bus of 48 lines coupled to sequential readout register 13 over bus 14. The output of readout register 13, namely bus 17, a twelve bit bus, causes readout data to be applied to output bus 18 or alternatively to be applied back into the input data bus of readin register 2, via data bus 19. Control of registers 2, 3, 11 and 13 is by means of a clock counter and decoder circuit 10. This circuit generates addresses for the four register sections of registers 2 and 13, and initiates transfers between registers 2 and 3 and 11 and 13. It operates from the system 120 ns clock which is also provided to address registers 8 and 9 so that addressing and writing and reading is done in synchronism.

The addition of registers 2, 3, 11 and 13 enables the pipelining of words thru the system at the 120 ns clock pulse rate, even though RAM 5 cannot operate at that rate. RAM 5 requires a total of 320 ns to input and output data (160 ns for each). Starting at time T0, the first word is transferred into cell 21 of readin register 2 in 120 ns; the next word is transferred into the adjacent cell 22 of readin register 2 in 120 ns, until the fourth word is inserted into register 2, all words being inserted in a total 480 ns. On the leading edge of the next 120 ns clock pulse, all four words are transferred into write data register 3 via bus 4. Subsequently, RAM 5 is addressed by the binary address specified by address register 8, to cause the four words within register 3 to be transferred in parallel into the selected cell of RAM 5. A period of 240 ns i.e., two of four available clock periods is allocated for this, the other 240 ns being allocated for reading. In other words the RAM is accessed and records a word in two clock cycles rather than in one, so that 240 ns are available to operate RAM 5. As only 160 ns are required, extra time is available for the inputting of the words into the selected cells of the RAM. The extra time is used to increase the safety margins between the critical timing signals of the RAM in order to guarantee that no data is lost or corrupted.

Let it be assumed that a word just read into the RAM is to be immediately readout. In this case, the same cell which just recorded a word is addressed by read address register 9, to cause the word to be readout of RAM 5 and applied to read data register 11 over data bus 12. As in the case of reading of data into RAM 5, 2 clock cycles are utilized, so that read data register 11 is loaded within the period of 240 ns. Thus, since it takes 160 nano seconds to readout the data from RAM 5, the two clock cycle 240 ns period allocated is more than enough to perform this function. During all this time, more data is being read into register 2 and previous data is being read out of register 13. During the next clock cycle (while new data is being read into memory), data is transferred in parallel from register 11 into register 13 via bus 14. The last of the four previous words is at the same time read out onto Bus 17. In the following four 120 ns clock periods, each of the four words stored in sequential readout register 13 are sequentially applied to output data bus 17 under control of counter/decoder 10.

As a result of the above described organization, one 12 bit word is inputted into the system during each 120 ns clock period and outputted from the system during each 120 ns clock period, notwithstanding the fact that RAM 5 requires a greater period, i.e. 160 ns, to readin and 160 ns to readout data. At the end of the "first" 480 nano second period, all "four" words have been inserted into readin register 2. During the "fifth" clock period, a new "fifth" word may be inserted into the first cell 21 of readin register 2 because register 2 is readout on the leading edge, early in the clock cycle in about 24 ns and it takes only 10 nano seconds to thereafter read the fifth word into cell 21 of register 2. In other words, because of the rapid readout of register 2 in about 24 ns, the fifth word may be inserted into cell 21 of readin register 2 just after the register is emptied since there is 120 ns available to readout the "first" word and readin the "fifth" word.

In effect four 12 bit words are converted into one 48 bit word which is written into and read out of the memory. After readout, the 48 bit word is than broken down into four 12 bit words again.

In general terms if the system clock period, or pipeline period, is p ns and the number of bits in a word is 8. The amount of time available for memory processing can be increased to Np ns by providing a memory having N q bit word size and by providing a readin register with N sections, for converting N q bit words into one N.q bit word. In the present example N=4, q=12 and p=120 ns. Thus N q=48 and N.p=480 ns. In the present example the 48 bit memory is obtained through the use of four 12 bit memories which are addressed in common.

While particular embodiments of the present invention have been shown and described, it is apparent that various changes and modifications may be made, and it is therefore intended that the following claims cover all such modifications and changes as may fall within the true spirit and scope of this invention.

I claim:

1. A method of writing q-bit words into and reading q-bit words out of a memory having an access time longer than a system clock period of p ns comprising: providing a memory having an N×q bit word size, a read-in register with N [×] q-bit sections and a read-out register with n q-bit sections; for writing into said memory, loading N q-bit words into the sections of said register in sequence each in said period of p ns and then transferring the N×q-bit contents of said register to said memory simultaneously; and, for reading, simultaneously transferring an N×q-bit work from said memory to said read-out register and then sequentially reading out the contents of the sections of said read-out register q-bits at a time, each in p ns, whereby a period N×p ns will be available for writing into and reading out of said memory N×q-bits at a time.

2. Apparatus for increasing the amount of time available for writing q-bit words into and reading q-bit words out of a memory in a system having a pipelined q-bit data input, a q-bit data output and a system clock period of p ns, by N times p, where N is greater than one and q is greater than 1, comprising:

(a) a memory having an access time greater than p ns for storing said words;

(b) a read-in register having N sections of q bits, each with q parallel inputs, each of said sections having its input coupled in parallel to said q bit data input and for storing respective ones of said q-bit words;

(c) a write data register for storing N times q bits in N sections of q bits each, one section for each q-bit word, said write data register having as inputs the outputs of said read-in register and having its outputs coupled to said memory;

(d) a read data register for storing N times q bits in N sections of q bits each, one section for each q-bit word, said read data register having its inputs coupled to said memory;

(e) a read-out register having N sections of q bits, each of said sections coupled in parallel to the q bit data output, the inputs to said read-out register coupled to the outputs of said read data register and for storing respective ones of said q-bit words; and (f) timing means to:
  (i) sequentially enable said N sections of said read-in register to read in a q-bit data word every p ns;
  (ii) transfer N q-bit words of data from said read-in register to said write data register every N times p ns in p ns;
  (iii) write data from said write data register to said memory every N times p ns, during one-half a period lasting N times p ns;
  (iv) read data from said memory to said read data register every N time p ns during the other half of said period;
  (v) transfer N q-bit words of data from said read data register to said read-out data register every N times p ns in p ns; and
  (vi) sequentially enable said N sections of said read out register to read a q-bit data word out to said q bit data output every p ns.

3. Apparatus according to claim 2, wherein said timing means comprise a clock and a counter/decoder.

4. Apparatus according to claim 3, and further including a write register; and a read register for providing addresses to said memory, said read and write registers incremented by said clock.

5. Apparatus according to claim 2, wherein said memory with words of q×N bits comprises N memory sections, each with an equal plurality of storage locations for storing q-bit words, coupled to have corresponding memory locations addressed simultaneously by said means for addressing.

* * * * *